United States Patent
Eto

[11] Patent Number: 5,889,717
[45] Date of Patent: Mar. 30, 1999

[54] DYNAMIC RANDOM ACCESS MEMORY

[75] Inventor: Satoshi Eto, Kawasaki, Japan

[73] Assignee: Fujitsu Limited, Kanagawa, Japan

[21] Appl. No.: 987,835

[22] Filed: Dec. 9, 1997

[30] Foreign Application Priority Data

Mar. 3, 1997 [JP] Japan ................................ 9-047690

[51] Int. Cl.$^6$ .................................................. G11C 11/24
[52] U.S. Cl. .......................................... 365/210; 365/149
[58] Field of Search ...................................... 365/210, 149

[56] References Cited

U.S. PATENT DOCUMENTS

| | | | |
|---|---|---|---|
| 4,504,929 | 3/1985 | Takemae | 365/210 |
| 4,606,010 | 8/1986 | Saito | 365/210 |
| 5,255,235 | 10/1993 | Miyatake | 365/210 |
| 5,410,509 | 4/1995 | Morita | 365/210 |
| 5,532,963 | 7/1996 | Kushiyama et al. | 365/210 |
| 5,574,694 | 11/1996 | von der Ropp | 365/210 |

*Primary Examiner*—Tan T. Nguyen
*Attorney, Agent, or Firm*—Nikaido Marmelstein Murray & Oram LLP

[57] ABSTRACT

An nMOS transistor 31 has a gate connected to a bit line *BL with its source and drain short-circuited and connected to a dummy word line DWL0. After setting the bit lines BL and *BL to a precharge potential Vpr=Vii/2, a transfer gate 11 is turned on. Next, the potential on the dummy word line DWL0 is raised from Vs=Vpr−Vth, where Vth is a threshold voltage of the nMOS 31, to Vii and then a sense amplifier 30 is set in an active state. If a pMOS transistor is employed in place of the nMOS transistor 31, its source and drain are short-circuited and connected to the bit line *BL with its gate connected to the dummy word line DWL0.

13 Claims, 9 Drawing Sheets

DYNAMIC RANDOM ACCESS MEMORY

BACKGROUND OF THE INVENTION

1. Field of the Invention

The present invention relates to a Dynamic Random Access Memory (DRAM) and a semiconductor device including same.

2. Description of the Related Art

Figure 8:
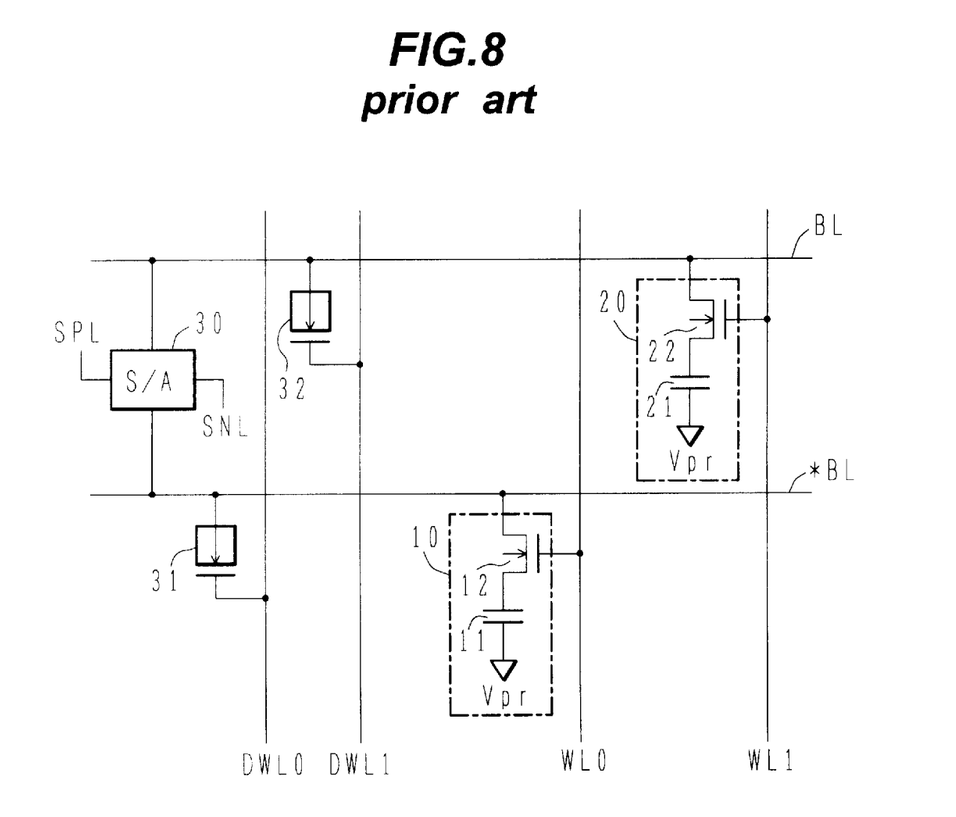
FIG. 8 is a circuit diagram showing part of a DRAM in the prior art.

FIG. 8 is a circuit diagram showing part of a prior art DRAM.

In a memory cell 10, one end of a capacitor 11 is connected through a transfer gate 12 to a bit line *BL, and in a memory cell 20, one end of a capacitor 21 is connected through a transfer gate 22 to a bit line BL. A potential Vpr=Vii/2 is applied to the other ends of the capacitors 11 and 21, where Vii is an internal power-supply voltage, e.g., 3.0 V. The gates of the transfer gates 12 and 22 are respectively connected to word lines WL0 and WL1.

When the contents of a memory cell, the cell 10 for instance, are to be read out, the bit lines BL and *BL are set to a precharge potential Vpr, then the transfer gate 12 is set to on for a proper time and the difference between the potentials of the bit line BL and the bit line *BL is amplified by a sense amplifier 30. When writing data in the memory cell 10, the bit line *BL is set to 0 V (writing a lower level "L") or to the internal power-supply potential Vii (writing a higher level "H") with the transfer gate 12 being on after said amplification, next the transfer gate 12 is turned off.

Figure 9A:
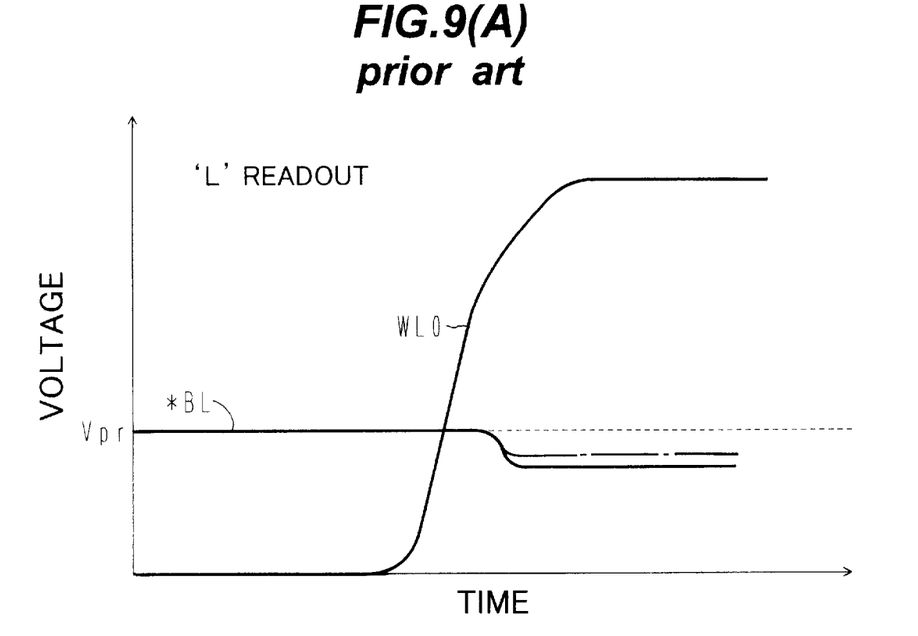
FIG. 9(A) is a voltage waveform diagram illustrating the operation of the circuit of FIG. 8 in "L" readout.
Figure 9B:
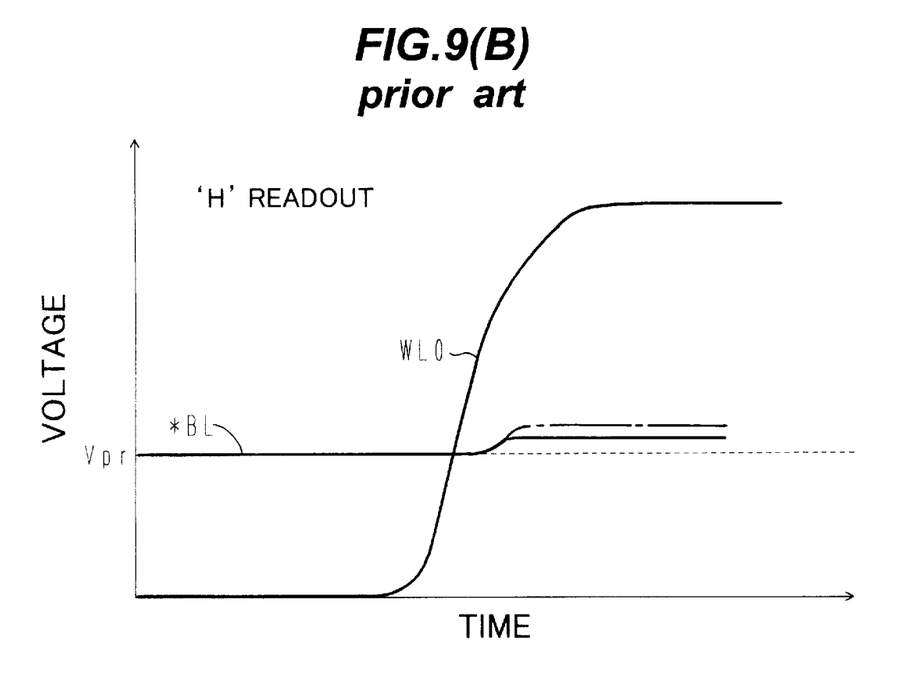
FIG. 9(B) is a voltage waveform diagram illustrating the operation of the circuit of FIG. 8 in "H" readout.

The solid lines in FIG. 9(A) indicate the waveforms of the voltages at the word line WL0 and the bit line *BL in reading out "L" from the memory cell 10, and the solid lines in FIG. 9(B) indicate waveforms of the voltages at the word line WL0 and the bit line *BL in reading out "H" from the memory cell 10.

Due to miniaturization of circuit elements and lowering operating voltages, the potential change Δ of the bit line *BL in readout becomes reduced. In addition, the ratio of the current leak at the capacitor 11 to the electrical charge held by the capacitor 11 increases. The current leak occurring when "H" is held in the capacitor 11 is larger than that occurring when "L" is held in the capacitor 11. Since, if the potential change Δ is too small, the sense amplifier operates erroneously, resulting in erroneous data readout, so it is necessary to give the potential change Δ a sufficient margin which allows the potential difference between the bit line BL and the bit line *BL to be amplified without the sense amplifier 30 operating erroneously.

Thus, in the prior art, the source and the drain of an nMOS transistor 31 are connected to the bit line *BL with its gate connected to a dummy word line DWLO, and likewise, an nMOS transistor 32 is connected between the bit line BL and a dummy word line DWL1. When reading out the contents of the memory cell 10, the potential of the word line WL0 is shifted to high to turn on the transfer gate 12, and at the same time, the potential of the dummy word line DWL0 is shifted from 0 V to the internal power-supply potential Vii to supplement a positive charge to the bit line *BL in order to compensate for the reduction in the potential change Δ due to the current leak at the capacitor 11. The alternate long and short lines in FIGS. 9(A) and 9(B) indicate waveforms of the voltages at the bit line *BL when such a compensating operation is performed.

However, since a positive charge, which is equal to or exceeding that supplemented to the bit line *BL in "H" readout, is supplemented to the bit line *BL in "L" readout, the margin contained in the potential change Δ in "L" readout is reduced, presenting a disadvantage.

SUMMARY OF THE INVENTION

Accordingly, an object of the present invention is to provide a semiconductor device including a DRAM with which it is possible to supplement the margin contained in a potential change of a bit line in "H" readout and to decrease the amount of reduction of the margin contained in that in "L" readout.

Figure 3A:
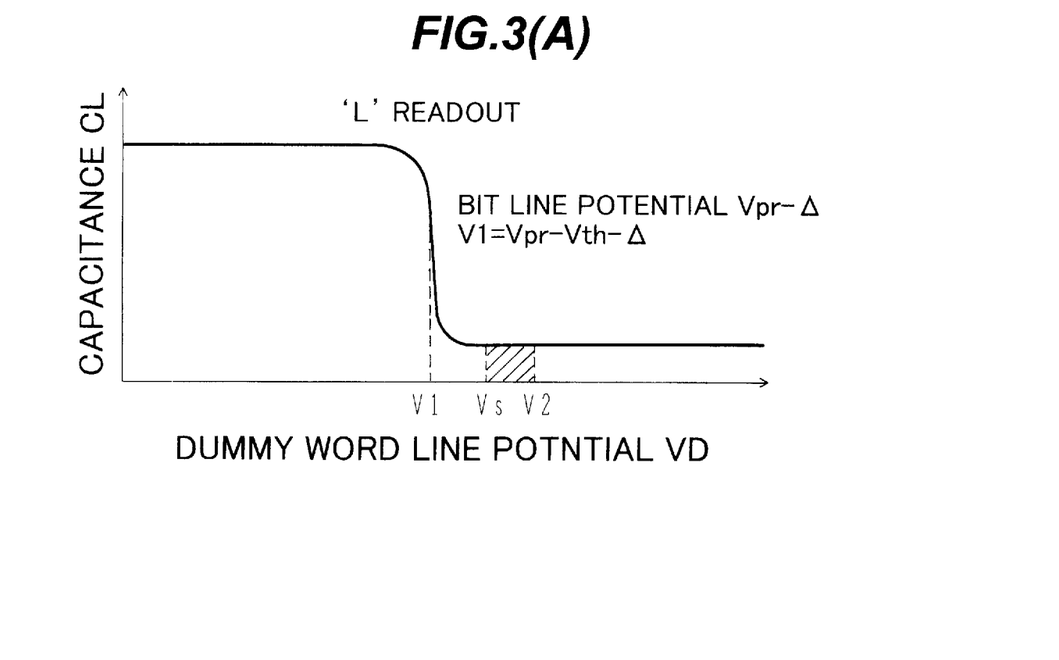
FIG. 3(A) is a characteristic diagram indicating MOS capacitances relative to dummy word line potentials in "L" readout.
Figure 3B:
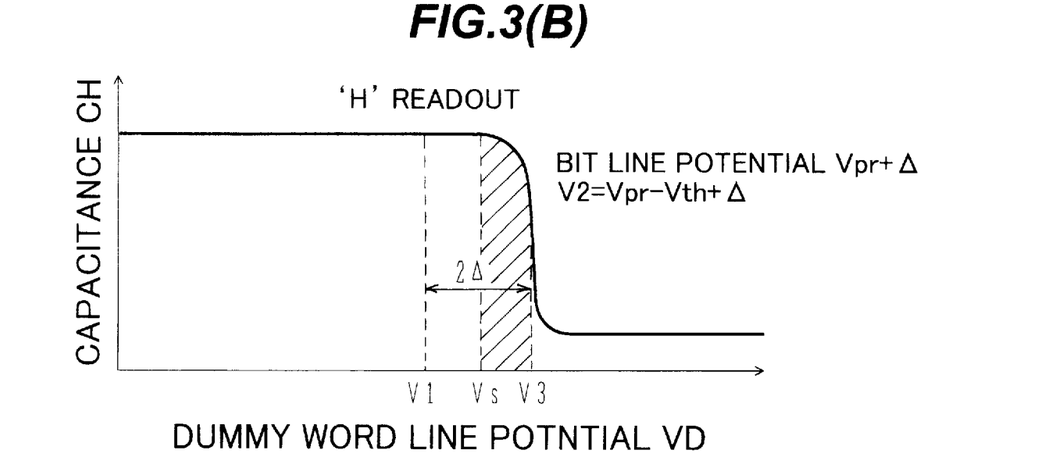
FIG. 3(B) is a characteristic diagram indicating MOS capacitances relative to the dummy word line potentials in "H" readout.

In the 1st aspect of the present invention, there is provided a semiconductor device comprising: a bit line (*BL); a memory cell (10) having a transfer gate (12) and a first capacitive element (11) connected through the transfer gate to the bit line; a sense amplifier (30) for amplifying a difference between a potential of the bit line and a reference potential when the sense amplifier is active; a dummy word line (DWL0); a second capacitive element (31), connected between the bit line and the dummy word line, its capacitance being variable in correspondence to its voltage; and a-control circuit (34 and 40), for turning on the transfer gate after setting the bit line to the reference potential (Vpr), for raising a potential of the dummy word line after turning on the transfer gate, for activating the sense amplifier after raising the potential of the dummy word line to a value, for example V1 as shown in FIGS. 3(A) and 3(B), on which capacitance of the second capacitive element is responsive to a logic level of the memory cell.

With this semiconductor device, the quantity of charge supplemented to the bit line in "H" readout is larger than that supplemented in "L" readout. Thus, advantages are achieved in that the margin contained in the bit line potential change δ H in "H" readout is supplemented and that the amount of decrease in the margin contained in the bit line potential change δ L in "L" readout is reduced, which contribute to reduction in power consumption achieved by extending the refresh cycle or to an improvement in the reliability of the contents of memory.

In the 2nd aspect of the present invention, there is provided a semiconductor device according to the 1st aspect, wherein the second capacitive element is an nMOS having a gate electrode and a n-type electrode, the gate electrode being connected to the bit line, the n-type electrode being connected to the dummy word line.

In this case, when the dummy word line potential (VD) rises to the value at which the potential difference between the gate and the n-type electrode of the nMOS (31) is equal to or exceeds the threshold voltage of the nMOS, the capacitance between the gate and the n-type electrode is rapidly reduced.

In the 3rd aspect of the present invention, there is provided a semiconductor device according to the 1st aspect, wherein the second capacitive element is an pMOS (31A) having a gate electrode and a p-type electrode, the gate electrode being connected to the dummy word line, the p-type electrode being connected to the bit line.

In this case, when the dummy word line potential rises to the value at which the potential difference between the gate and the source of the pMOS (31A) is equal to or lower than the threshold voltage of the transistor, the capacitance between the gate and the source of the pMOS is reduced rapidly.

In the 4th aspect of the present invention, there is provided a semiconductor device according to the 1st aspect, wherein the control circuit comprises a CMOS inverter (41 and 42) powered by a voltage between a power-supply potential (Vii) and a bias potential (Vs), the CMOS inverter having an output connected to the dummy word line.

By transiting the input potential of the CMOS to low, the dummy word line potential is caused to rise from the bias potential (Vs) to the power-supply potential (Vii).

In the 5th aspect of the present invention, there is provided a semiconductor device according to the 4th aspect 6, wherein the control circuit comprises a step-down circuit (60) for generating the bias potential (Vs) by stepping down the reference potential (Vpr).

In the 6th aspect of the present invention, there is provided a semiconductor device according to the 5th aspect, wherein the step-down circuit comprises: a level shift circuit (61) for shifting down the reference potential (Vpr) by a threshold voltage (Vth) of a MOS transistor; an output MOS transistor (651) connected between a conductor supplied with a power-supply potential and the output of the step-down circuit; and a comparator circuit (63) for controlling in such a way that a gate electrode potential of the output MOS transistor approaches to an output potential of the level shift circuit.

With this semiconductor device, an advantage is achieved in that it is possible to achieve a relatively large ratio δH/δL since the bias potential is set to a level that is lower than the reference potential by the threshold voltage of a MOS transistor.

In the 7th aspect of the present invention, there is provided a semiconductor device according to the 6th aspect, wherein the level shift circuit comprises: a shifting MOS transistor for shifting down the reference potential by a threshold voltage of the shifting MOS transistor; and a voltage dividing load element connected between the shifting MOS transistor and a conductor supplied with a reference potential; wherein the output of the level shift circuit is a midpoint of the voltage dividing load element.

With this semiconductor device, an advantage is achieved in that, by setting the divided voltage at an appropriate value, the margins contained in δL and δH can be set approximately equal to each other with satisfying the relationship δL<δH.

In the 8th aspect of the present invention, there is provided a semiconductor device according to the 6th aspect, wherein the control circuit comprises a CMOS inverter powered by a voltage between a power-supply potential and a ground potential, the CMOS inverter having an output connected to the dummy word line.

Although the voltage δL becomes larger than that using the bias potential, the amount of decrease in the margin in "L" readout is still small when the internal power-supply voltage is low, e.g., lower than 2.5 V. In order to further reduce δL, the threshold voltage at the second capacitive element should be increased.

In the 9th aspect of the present invention, there is provided a dynamic semiconductor memory comprising: a bit line; a memory cell having a first capacitive element connected to the bit line; a dummy word line; and a second capacitive element, connected between the bit line and the dummy word line; wherein capacitance of the second capacitive element is responsive to a logic level of the memory cell.

DESCRIPTION OF THE PREFERRED EMBODIMENTS

Referring now to the drawings, wherein like reference characters designate like or corresponding parts throughout several views, preferred embodiments of the present invention are described below. A binary signal or its signal line that is complementary to a binary signal S or its signal line S is designated as *S.

First Embodiment

Figure 1:
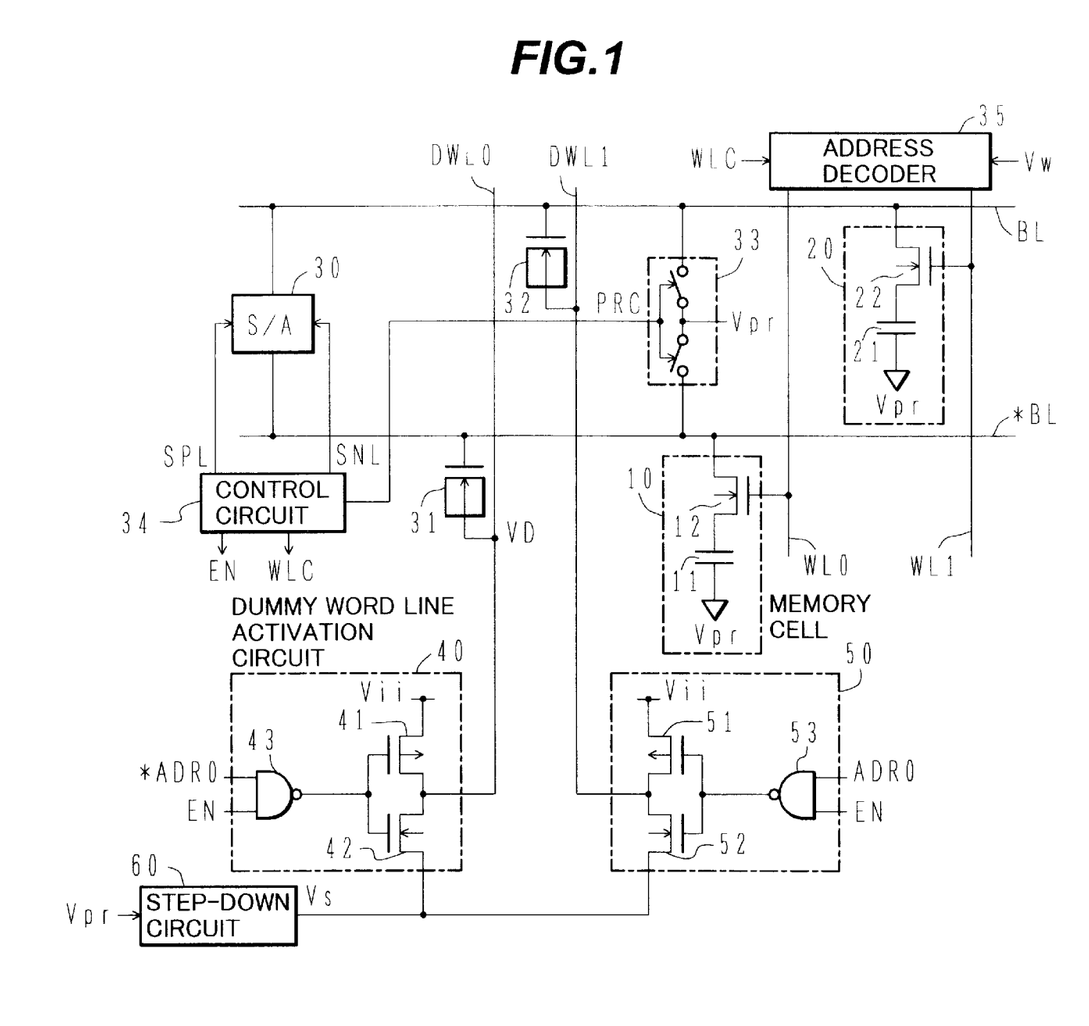
FIG. 1 is a circuit diagram showing part of the DRAM in a first embodiment according to the present invention.

FIG. 1 shows a circuit diagram of part of a DRAM in the first embodiment according to the present invention. For purposes of simplification of the explanation, FIG. 1 shows a structure provided with two memory cells.

The gate of an nMOS transistor 31 as a second MOS capacitive element is connected to a bit line *BL, with its source and drain short-circuited and connected to a dummy word line DWL0. Likewise, the gate of an nMOS transistor 32 as a second MOS capacitive element is connected to a bit line BL, with its source and drain short-circuited and connected to a dummy word line DWL1.

A precharge switching circuit 33 is connected between the bit lines BL and *BL so that the bit lines BL and *BL are precharged at the potential Vpr when the switching circuit 33 is on. A control circuit 34 performs on/off control of the switching circuit 33.

The word lines WL0 and WL1 are alternatively selected by an address decoder 35. The timing with which a word selection potential Vw is applied to a selected word line WL0 or WL1 is controlled by a timing control signal WLC provided by the control circuit 34. The word selection potential Vw may be, for instance, Vii+Vth, where Vth is the threshold voltage of the nMOS transistor.

A pair of activation signals SPL and SNL are provided to the sense amplifier 30 by the control circuit 34, and when the activation signals SPL and SNL are both at the precharge potential Vpr, the sense amplifier 30 enters an inactive state, whereas when the activation signal SPL is set to the internal power-supply potential Vii and the activation signal SNL is set to 0 V, the sense amplifier 30 enters an active state.

In a dummy word line activation circuit 40, the drains of a pMOS transistor 41 and an nMOS transistor 42 are connected to the dummy word line DWL0. The internal power-supply potential Vii is applied to the source of the pMOS transistor 41 and a potential Vs, which is to be detailed later, is applied to the source of the nMOS transistor 42. The gates of the pMOS transistor 41 and the nMOS transistor 42 are both connected to the output of a NAND gate 43. The least significant bit *ADR0 of address is provided to one input of the NAND gate 43 and an enable signal EN is provided to another input of the NAND gate 43 by the control circuit 34. The least significant bit ADR0 of address is set to "L" when the word line WL0 is selected and is set to "H" when the word line WL1 is selected.

The dummy word line DWL1 is connected to a dummy word line activation circuit 50 as in the case of the dummy word line DWL0 and a pMOS transistor 51, an nMOS transistor 52 and a NAND gate 53 in the dummy word line activation circuit 50 correspond to the pMOS transistor 41, the nMOS transistor 42 and the NAND gate 43 respectively of the dummy word line activation circuit 40. The least significant bit ADR0 is provided to one input of the NAND gate 53 and an enable signal EN is provided to another input of the NAND gate 53 by the control circuit 34.

The switching circuit 33 and the dummy word line activation circuits 40 and 50 constitute part of the control circuit.

Figure 2:
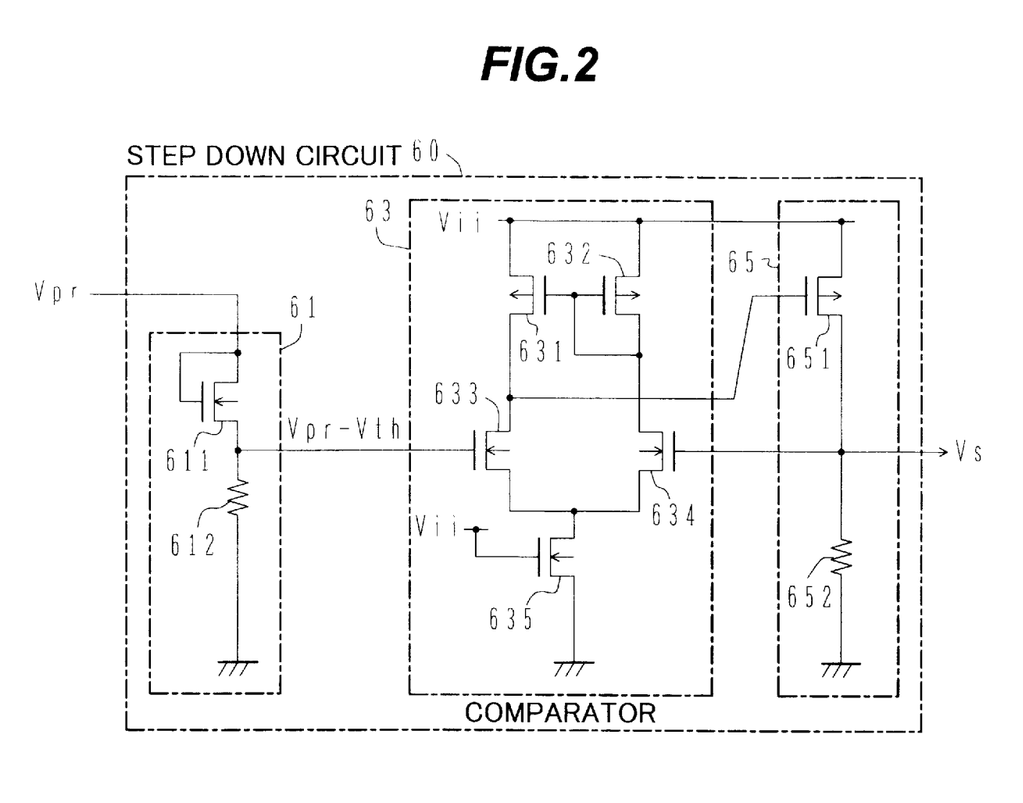
FIG. 2 is a diagram showing a structural example of the step-down circuit in FIG. 1.

A step-down circuit 60 generates the potential Vs by stepping down the voltage of the precharge potential Vpr, and the potential Vs is applied to the sources of the nMOS transistors 42 and 52. FIG. 2 shows a structural example of the step-down circuit 60. This step-down circuit 60 is provided with a level shift circuit 61, a comparator circuit 63 and an output circuit 65 to output a stabilized potential Vs. In the level shift circuit 61, a nMOS transistor 611, which gate and drain are short-circuited to form a diode, and a resistor 612 are connected in series, and with the precharge potential Vpr applied to the drain of the nMOS transistor 611, Vpr−Vth is outputted from the source of the NMOS transistor 611 as the reference potential for the comparator circuit 63, where Vth is the threshold voltage of the nMOS transistor 611. For simplification, it is assumed that the threshold voltages of the nMOS transistors 31 and 32 in FIG. 1 are both equal to Vth, too.

The comparator circuit 63, the output circuit 65 and their connections are of the known art, with the comparator circuit 63 having pMOS transistors 631 and 632 and nMOS transistors 633–635 and the output circuit 65 having a pMOS transistor 651 and a resistor 652 connected in series. The comparator circuit 63 controls the gate potential of the pMOS transistor 651 so that the drain potential Vs at the pMOS transistor 651 is set to the reference potential Vpr−Vth.

For instance, Vii=3.0 V, Vpr=1.5 V, Vth=0.5 V, Vs=1.0 V and Δ=0.2 V may be set.

Although FIG. 1 shows a structure in which only one pair of bit lines is provided, the dummy word lines DWL0 and DWL1 are used commonly by two or more pairs of bit lines.

Figure 4A:
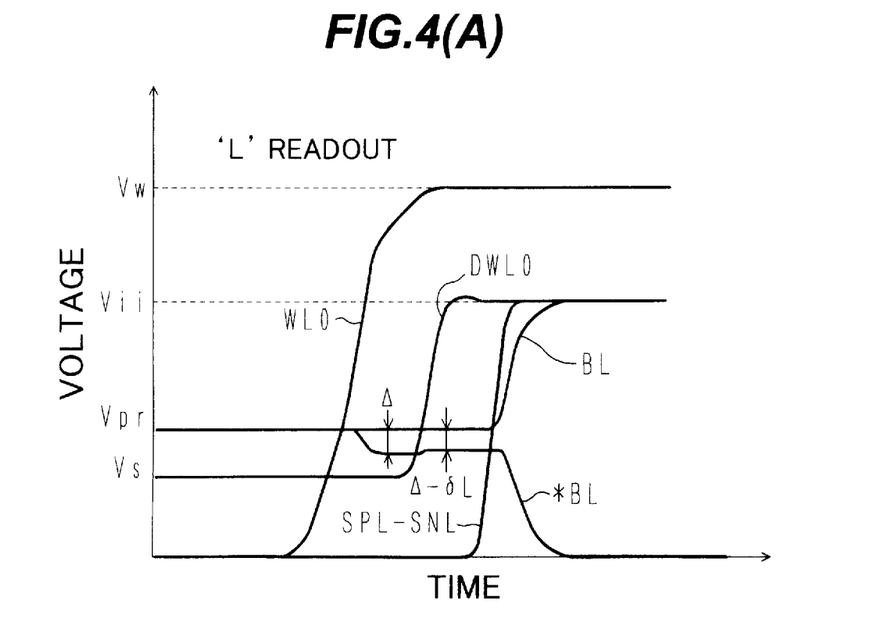
FIG. 4(A) is a voltage waveform diagram illustrating a readout operation from a memory cell holding "L"
Figure 4B:
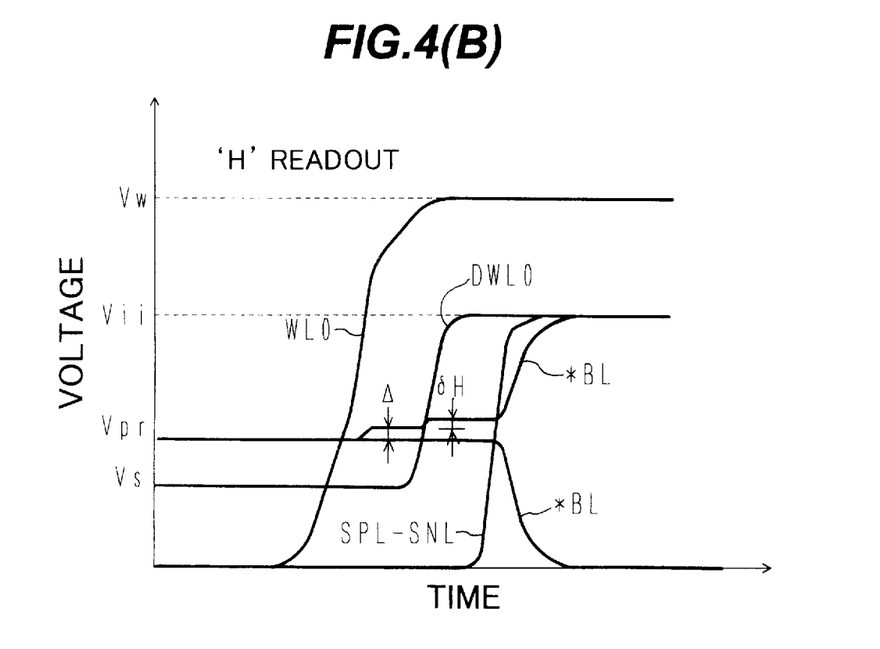
FIG. 4(B) is a voltage waveform diagram illustrating a readout operation from a memory cell holding "H"

Next, in reference to FIGS. 4(A) and 4(B), the operation of the circuit shown in FIG. 1 structured as described above is explained. Since the current leak occurring when "H" is held in the capacitor 11 is larger than the current leak occurring when "L" is held in the capacitor 11, the bit line potential change in "L" readout and the bit line potential change in "H" readout are different from each other. However, for simplification, it is assumed that they are equal to each other at Δ.

FIG. 4(A) shows the voltage waveform which will occur in a readout operation from the memory cell 10 when "L" is held in the capacitor 11, and FIG. 4(B) shows the voltage waveform which will occur in a readout operation from the memory cell 10 when "H" is held in the capacitor 11.

In these cases, since the least significant bit ADR0 of the address is at "L", the output from the NAND gate 53 is set at "H" regardless of the logical level of the enable signal EN, turning off the pMOS transistor 51 and turning on the nMOS transistor 52, thereby the potential of the dummy word line DWL1 remaining at Vs. Since, although the least significant address bit *ADR0 is at "H", the enable signal EN is at "L" at the beginning of a readout cycle, the dummy word line DWL0 is set to the potential Vs. In addition, at the beginning of the readout cycle, the activation signals SPL and SNL are both set to the precharge potential Vpr, setting the sense amplifier 30 in an inactive state.

In the case illustrated in FIG. 4(A), the following operation is performed.
(1) The switching circuit 33 is turned on, the bit lines BL and *BL are precharged at the potential Vpr and the switching circuit 33 is turned off.
(2) Next, the word line WL0 is selected with its potential rising up to the potential Vw. During this process, the transfer gate 12 is turned on so that a positive charge on the bit line *BL flows through the transfer gate 12 into the capacitor 11. With this, the potential of the bit line *BL is lowered by Δ to Vpr−Δ.
(3) Next, the enable signal EN transits to "H", the output of the NAND gate 43 transits to "L", the pMOS transistor 41 is turned on and the nMOS transistor 42 is turned off. With this, the potential of the dummy word line DWL0 rises from Vs to Vii. When this happens, part of a negative charge flows from the bit line *BL toward the gate of the nMOS transistor 31, as a result, a positive charge is supplemented to the bit line *BL, thereby raising the potential of the bit line *BL by δ L.
(4) The activation signal SPL is raised to the level of the internal power-supply potential Vii, the activation signal SNL is lowered to 0 V and the sense amplifier 30 becomes active. With this, the difference between the potentials of the bit line BL and the bit line *BL is amplified, setting the bit line *BL to 0 V and setting the bit line BL to the internal power-supply potential Vii.

In the operation of reading out "H" from the memory cell 10: corresponding to (2) above, a positive charge in the capacitor 11 flows through the transfer gate 12 out to the bit line *BL to raise the potential of the bit line *BL by Δ to Vpr+Δ; corresponding to (3) above, the potential of the bit line *BL is raised by δ H; and corresponding to (4) above, the potential of the bit line *BL is set to the internal power-supply potential Vii and the potential of the bit line BL is set to 0 V.

In the operation of reading out from the memory cell 20, the least significant address bit ADR0 is set to "H": corresponding to (2) above, the word line WL1 is selected; and corresponding to (3) above, the potential of the dummy word line DWL1 rises from the potential Vs to the internal power-supply potential Vii to supplement a positive charge to the bit line BL.

FIG. 3(A) shows the capacitance CL of the nMOS transistor 31 relative to the potential VD of the dummy word line DWL0 when the potential of the bit line *BL is at Vpr−Δ in (2) above in the operation of reading out "L" from the memory cell 10. When the dummy word line potential VD exceeds V1=Vpr−Vth−Δ, the nMOS transistor 31 is set in an off state between the source and the drain, resulting in a rapidly diminished capacitance CL. When the potential of the dummy word line DWL0 is raised from Vs to Vii, an amount of electrical charge in the n-channel area of the nMOS transistor 31 is equal to a value calculated by integrating the capacitance CL from Vs to Vii with respect to the potential VD, and this amount of electrical charge is supplemented to the bit line *BL.

FIG. 3(B) shows the capacitance CH of the nMOS transistor 31 relative to the potential VD of the dummy word line DWL0 when the potential of the bit line *BL is at Vpr+Δ in (2) above in the operation of reading out "H" from the memory cell 10. When the dummy word line potential VD exceeds V1=Vpr−Vth+Δ, the nMOS transistor 31 is set in an off state between the source and the drain, resulting in a rapidly diminished capacitance CH. When the potential of the dummy word line DWL0 is raised from Vs to Vii, an amount of electrical charge in the n-channel area of the nMOS transistor 31 is equal to a value calculated by integrating the capacitance CH from Vs to Vii with respect to the potential VD, and this amount of electrical charge is supplemented to the bit line *BL.

Consequently, the quantity of electrical charge supplemented to the bit line *BL in "H" readout is larger by the difference between the shaded area in FIG. 3(B) and the shaded area in FIG. 3(A) compared to the electrical charge supplemented in "L" readout, satisfying δL<δH. δ Likewise, in a readout operation from the memory cell 20, too, δL<δH is satisfied.

As a result, an advantage is achieved in that the margin of the potential change at a bit line in "H" readout is compensated, whereas the amount of decrease in margin of the potential change at a bit line in "L" readout is reduced. With the margin increased in this manner, the refresh cycle for the DRAM can be lengthened to reduce power consumption or the reliability of the memory contents can be improved.

It is to be noted that the relationship δL<δH is satisfied as long as Vs<V2, and in this case, the advantage of the present invention is obtained.

Figure 5:
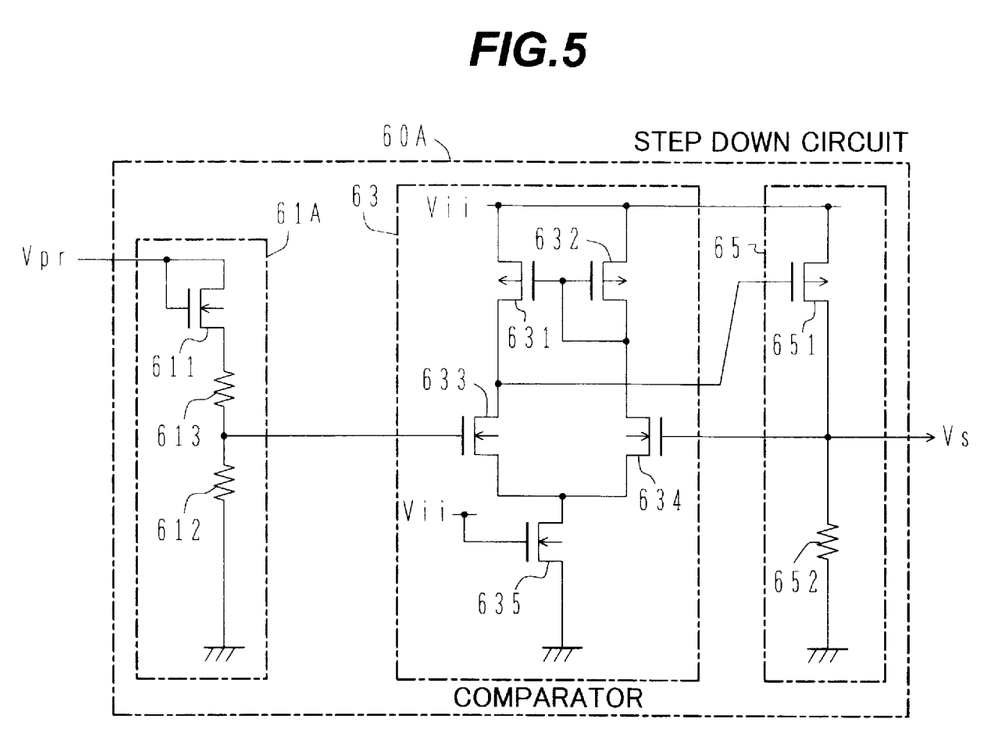
FIG. 5 shows a step-down circuit in a DRAM in the second embodiment according to the present invention.

Second Embodiment FIG. 5 shows a step-down circuit 60A employed in a DRAM of the second embodiment of the present invention.

In this circuit 60A, in a level-shift circuit 61A, a resistor 613 is connected between an nMOS transistor 611 and a resistor 612 and the potential at a connection point between the resistors 612 and 613 is outputted as a reference potential. In this case, the potential Vs is lower than the potential Vs in FIG. 2 by the voltage between the ends of the resistor 613. For instance, in FIG. 3, Vs may be set to V1. Other features are identical to those in the first embodiment.

By the way, since the current leak occurring when "H" is held in the capacitor 11 is larger than that occurring when "L" is held in the capacitor 11, it is necessary to increase the margin when "H" is held in the capacitor 11.

In the second embodiment, by setting the resistance value of the resistor 613 properly, the above-described margins in a "L" state and in a "H" sate can be made approximately equal to each other by setting the value of δH larger than that in the first embodiment, with satisfying the relationship δL<δH.

Third Embodiment

Figure 6:
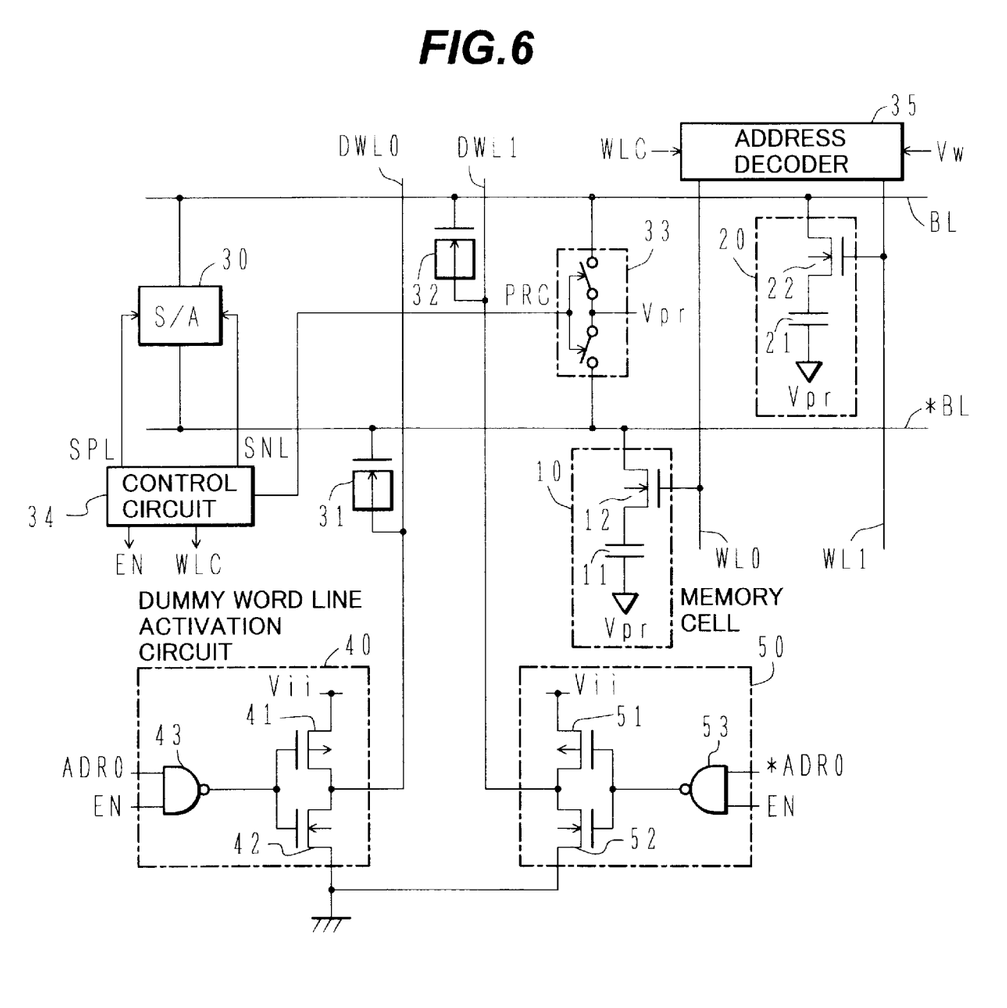
FIG. 6 is a circuit diagram showing part of a DRAM in the third embodiment according to the present invention.

FIG. 6 shows a circuit diagram of part of a DRAM in the third embodiment according to the present invention.

In this circuit, by setting the sources of the nMOS transistor 42 and 52 to 0 V, the step-down circuit 60 in FIG. 1 is omitted.

In the circuit of FIG. 1, the step-down circuit 60 may be positioned on a restricted region in a DRAM core area where circuits are already congested. In contrast, in the third embodiment, since the step-down circuit 60 is not needed, the layout of the circuit is simplified, thereby achieving an advantage in that the design time can be shortened.

In the third embodiment, although the voltage δL is larger than that in the first and second embodiments, since the potential V1 in FIGS. 3(A) and 3(B) is reduced when the internal power-supply voltage Vii is low, e.g., when it is lower than 2.5 V, the amount of decrease in the margin in "L" readout is limited. Therefor, in consideration of the advantages described above, there are situations in which this embodiment is more advantageous than the first embodiment.

In order to further lower the potential V1, the threshold voltage Vth of the nMOS transistors 31 and 32 should be increased. To accommodate this, the nMOS transistors 31 and 32 may be located in the well where the memory cells are formed or the nMOS transistors 31 and 32 may be formed by employing a method similar to that employed for forming the transfer gates, for instance.

Fourth Embodiment

Figure 7:
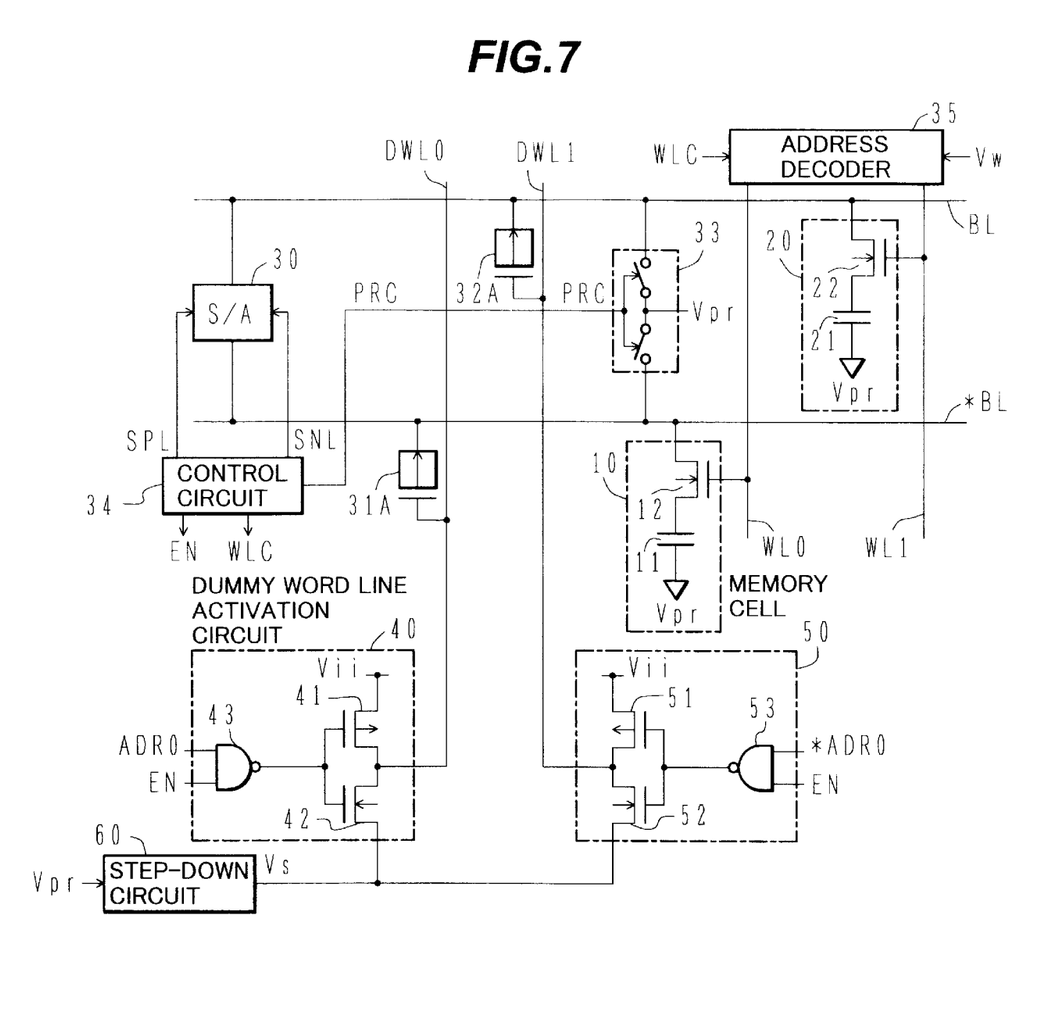
FIG. 7 is a circuit diagram showing part of a DRAM in the fourth embodiment according to the present invention.

FIG. 7 shows a circuit diagram of part of a DRAM in the fourth embodiment of the present invention.

In this circuit, instead of the nMOS transistor 31 as a MOS capacitive element in FIG. 1, a pMOS transistor 31A is employed, and its source and drain are short-circuited and connected to the bit line *BL with its gate connected to the dummy word line DWL0. Likewise, in place of the nMOS transistor 32 as a MOS capacitive element in FIG. 1, a pMOS transistor 32A is employed, and its source and drain are short-circuited and connected to the bit line BL with its gate connected to the dummy word line DWL1. Other features of this embodiment are identical to those in the first embodiment.

In this fourth embodiment, since the relationship illustrated in FIGS. 3(A) and 3(B) is satisfied, the same advantages as of the first embodiment are obtained.

Although preferred embodiments of the present invention has been described, it is to be understood that the invention is not limited thereto and that various changes and modifications may be made without departing from the spirit and scope of the invention.

For instance, a MOS capacitive element is not restricted to a MOS transistor and, for instance, a structure in which either the source or drain is omitted or a structure similar to that may be adopted.

In addition, the signal for selecting a dummy word line is not limited to the least significant address bit ADR0, and a signal that corresponds to the structure of a memory cell array may be employed.

In place of the nMOS transistor 611 with its gate and drain short-circuited in FIG. 2 or FIG. 5, a pMOS transistor with its gate and drain short-circuited may be employed.

The step-down circuit 60 in FIG. 7 may be omitted by setting Vs=0. In this case, for the reason stated above, the threshold voltages of the pMOS transistors 31A and 31B may be raised by forming them in the well which potential is set higher than the internal power-supply voltage Vii, e.g., at a word selection potential Vw or by increasing the channel width of the transistors.

What is claimed is:

1. A semiconductor device comprising:
   a bit line;
   a memory cell having a transfer gate and a first capacitive element connected through said transfer gate to said bit line;
   a sense amplifier for amplifying a difference between a potential of said bit line and a reference potential when said sense amplifier is active;
   a dummy word line;
   a second capacitive element, connected between said bit line and said dummy word line, its capacitance being variable in correspondence to a potential of said dummy word line; and
   a control circuit, for turning on said transfer gate after setting said bit line to said reference potential, for raising the potential of said dummy word line after turning on said transfer gate, for activating said sense amplifier after raising said potential of said dummy word line to a value on which capacitance of said second capacitive element is responsive to a logic level of said memory cell.

2. A semiconductor device according to claim 1, wherein said second capacitive element is an nMOS having a gate electrode and a n-type electrode, said gate electrode being connected to said bit line, said n-type electrode being connected to said dummy word line.

3. A semiconductor device according to claim 2, wherein said nMOS is a transistor having source and drain electrodes, said source and drain electrodes being short-circuited to each other to form said n-type electrode.

4. A semiconductor device according to claim 1, wherein said second capacitive element is an pMOS having a gate electrode and a p-type electrode, said gate electrode being connected to said dummy word line, said p-type electrode being connected to said bit line.

5. A semiconductor device according to claim 4, wherein said pMOS is a transistor having source and drain electrodes, said source and drain electrodes being short-circuited to each other to form said p-type electrode.

6. A semiconductor device according to claim 1 wherein said control circuit comprises a CMOS inverter powered by a voltage between a power-supply potential and a bias potential, said CMOS inverter having an output connected to said dummy word line.

7. A semiconductor device according to claim 6, wherein said control circuit comprises a step-down circuit for generating said bias potential by stepping down said reference potential.

8. A semiconductor device according to claim 7, wherein said step-down circuit comprises:
   a level shift circuit for shifting down said reference potential by a threshold voltage of a MOS transistor;
   an output MOS transistor connected between a conductor supplied with a power-supply potential and said output of said step-down circuit; and
   a comparator circuit for controlling in such a way that a gate electrode potential of said output MOS transistor approaches to an output potential of said level shift circuit.

9. A semiconductor device according to claim 8, wherein said level shift circuit comprises:
   a shifting MOS transistor for shifting down said reference potential by a threshold voltage of said shifting MOS transistor; and
   a voltage dividing load element connected between said shifting MOS transistor and a conductor supplied with a reference potential;
   wherein said output of said level shift circuit is a midpoint of said voltage dividing load element.

10. A semiconductor device according to claim 1 wherein said control circuit comprises a CMOS inverter powered by a voltage between a power-supply potential and a ground potential, said CMOS inverter having an output connected to said dummy word line.

11. A semiconductor device according to claim 1, further comprising another bit line, wherein said reference potential is of said another bit line.

12. A semiconductor device according to claim 1, wherein said semiconductor device is a dynamic access memory.

13. A dynamic semiconductor memory comprising:
   a bit line;
   a memory cell having a first capacitive element connected to said bit line;
   a dummy word line; and
   a second capacitive element, connected between said bit line and said dummy word line;
   wherein capacitance of said second capacitive element is responsive to a logic level of said memory cell.

* * * * *